United States Patent
Silfvast et al.

(10) Patent No.: US 6,232,613 B1
(45) Date of Patent: May 15, 2001

(54) DEBRIS BLOCKER/COLLECTOR AND EMISSION ENHANCER FOR DISCHARGE SOURCES

(75) Inventors: William T. Silfvast, St. Helena, CA (US); Greg Shimkaveg, Oviedo, FL (US)

(73) Assignee: University of Central Florida, Orlando, FL (US)

( * ) Notice: Subject to any disclaimer, the term of this patent is extended or adjusted under 35 U.S.C. 154(b) by 0 days.

(21) Appl. No.: 09/141,737

(22) Filed: Aug. 27, 1998

Related U.S. Application Data

(63) Continuation-in-part of application No. 09/001,696, filed on Dec. 31, 1997, now Pat. No. 6,031,241, which is a continuation-in-part of application No. 08/815,283, filed on Mar. 11, 1997, now Pat. No. 5,963,616.

(51) Int. Cl.$^7$ .................................................... G21G 4/00
(52) U.S. Cl. ................................ 250/504 R; 250/493.1
(58) Field of Search .......................... 250/504 R, 493.1; 378/119, 143

(56) References Cited

U.S. PATENT DOCUMENTS

| | | | |
|---|---|---|---|
| 5,499,282 | 3/1996 | Silfvast | 378/119 |
| 5,504,795 | 4/1996 | McGeoch | 378/119 |
| 5,563,923 | 10/1996 | Okada et al. | 378/138 |
| 5,577,092 | 11/1996 | Kublak et al. | 378/119 |
| 5,585,641 | 12/1996 | Sze et al. | 250/492.1 |
| 5,606,588 | 2/1997 | Umstadter et al. | 378/119 |
| 5,963,616 | * 10/1999 | Silfvast et al. | 250/504 R |
| 6,031,241 | * 2/2000 | Silfvast et al. | 250/504 R |
| 6,064,072 | * 5/2000 | Partlo et al. | 250/504 R |

OTHER PUBLICATIONS

Ceglio, Hawryluk, and Sommargren, "Front–end design issues on soft–x–ray projection lithography", Applied Optics, vol. 32, No. 34, Dec. 1, 1993, pp. 7050–7056.

* cited by examiner

*Primary Examiner*—Kiet T. Nguyen
(74) *Attorney, Agent, or Firm*—Brian S. Steinberger; Law Offices of Brian Steinberger

(57) ABSTRACT

An angular pumped and emitting capillary(APEC) discharge light source having a blocking electrode installed on the axis of the capillary just beyond the end of the capillary bore. Thus, the emitting region occurs in an angular fashion between the end of the capillary and the blocking electrode. The blocking electrode prevents debris generated within the capillary from being expelled onto collecting optics for the discharge source. A second version shapes the blocking electrode into a trap so that emitted debris will be collected within the trap. Alternatively, the trap can be a collector separate and apart from the electrodes of the light source. The capillary bore and electrode configuration allow for emissions to be enhanced by placing the electrode in front of the outlet to the capillary bore. A still another version has a discharge source without a capillary bore where gas flows through a first electrode to a space in front of a second electrode to generate a discharge therebetween so that debris is blocked and collected by the second electrode.

20 Claims, 7 Drawing Sheets

DEBRIS BLOCKER/COLLECTOR AND EMISSION ENHANCER FOR DISCHARGE SOURCES

This invention is a Continuation-In-Part of U.S. Ser. No. 09/001,696 filed on Dec. 31, 1997, now U.S. Pat. No. 6,031,241, entitled: Capillary Discharge Extreme Ultraviolet Lamp Source for EUV Microlithography and other Related Applications now issued as U.S. Pat. No. 6,081,241, which is a Continuation-In-Part of U.S. Ser. No. 08/815,283 filed on Mar. 11, 1997, now U.S. Pat. No. 5,963,616, entitled: Configurations, Materials and Wavelengths for EUV Lithium Plasma Discharge Lamps now issued as U.S. Pat. No. 5,963,616, both by the same assignee thereof, both of which are incorporated by reference. This invention is related to U.S. Pat. No. 5,499,282 to William T. Silfvast also by the same assignee of the subject invention which is also incorporated by reference.

This invention relates to differentially pumped capillary (DPC) discharge sources, and in particular to methods and apparatus for an angular pumped and emitting capillary (APEC) for applications in extreme ultraviolet (EUV) lithography, microscopy, materials processing, metrology, resist analysis, as well as applications in other spectral regions such as the visible, ultraviolet, and vacuum ultraviolet for laser pumping and the like, where a small and very intense light source is required.

BACKGROUND AND PRIOR ART

A commercially suitable Soft-X-Ray or EUV lithography facility will require an intense soft x-ray/EUV light source that can radiate within a specific wavelength region within the range of approximately 11 to 14 nm in the EUV part of the electromagnetic spectrum. Capillary discharge sources have been proposed that can be used in such a facility. One such embodiment of the proposed capillary discharge source was first described in U.S. Pat. No. 5,499,282 by William T. Silfvast issued on Mar. 12, 1996. That particular proposed source would operate in a lithium vapor electrically excited to within specific ranges of plasma electron temperatures (10–20 eV) and electron densities ($10^{16}$ to $10^{21}$ cm$^{-3}$) which are required for optimally operating a lithium vapor discharge lamp at 13.5 nm. That same patent also proposed soft-x-ray lamps at wavelength of 7.6, 4.86, and 3.38 nm in beryllium, boron, and carbon plasmas. These wavelengths, however, are not within the range of wavelengths required for EUV lithography. Although that patent described the general features of these lamps, it did not give the specific discharge current operating range that would minimize bore erosion and the emission of debris from the lithium lamp, or the appropriate range of bore sizes for operating such a lamp. That patent did not mention the use of other materials, such as atomic or molecular gases that could be successfully operated in the lamp configurations described in that patent; it naturally follows that neither could it have mentioned what are the preferred operating pressure ranges of those gases that would be suitable for EUV lithography.

Another proposed discharge source for use with EUV lithography was the "differentially pumped capillary" discharge source that was described in U.S. Ser. No. 09/001, 696 filed on Dec. 31, 1997, now U.S. Pat. No. 6,031,241, entitled: Capillary Discharge Extreme Ultraviolet Lamp Source for EUV Microlithography and other Related Applications now issued as U.S. Pat. No. 6,031,241, by the same assignee, which is incorporated by reference.

The "differentially pumped capillary" or DPC, allows a lamp that uses a gas as the discharge radiating medium (as opposed to a lamp that uses metal vapors) to operate without a window between the gaseous region and the optics that collect the radiation emitted from the lamp. This is particularly applicable in the 11 nm to 14 nm wavelength region where EUV lithography operates. Because of the very strong absorption of radiation in that wavelength region by all materials, including gases, it is necessary in an EUV lithography system (as well as other applications) to operate the imaging system within a very low pressure environment having a pressure of less than approximately 0.01 Torr. Hence, a lamp would generally need a window to separate the region of the lamp operating in the 0.1 to 50 Torr pressure region from the low pressure region (less than approximately 0.01 Torr) of the imaging system. The DPC allows for the operation of the lamp containing the radiating gas without the need of such a window.

In the operation of the DPC, the gas is inserted into the discharge capillary at the opposite end of the base from that where the radiation flux in the 11 nm to 14 nm radiation is collected. The pressure at the gas inlet end of the capillary would be at the range of from 0.1 to 50 Torr depending upon the particular gas and the desired emission characteristics of the lamp. The gas is pumped through the capillary by having a vacuum pump accessible to the opposite end of the capillary, the end where the radiation flux between 11 nm and 14 nm is collected and is used in the desired optical system such as EUV lithography. As the gas is pumped through the discharge capillary the pressure drops approximately linearly such that it is at the necessary low pressure (less than approximately 0.01 Torr) beyond the capillary. The lamp is operated just like other lamps that have a constant pressure over the length of the capillary bore region by initiating a pulsed discharge current within the capillary in the usual manner. We have observed that there is sufficient pressure within the capillary even at the low pressure side, to produce the desired emission from the lamp and yet the region beyond the lamp has sufficiently low pressure to allow for transmission of the radiation between 11 nm and 14 nm. The capillary itself acts as a retarding system for the gas as it flows through the capillary so that the usage of gas is at a very low rate. The gas can also be recycled back to the high pressure side for reuse.

A problem has been observed with these discharge sources described above. During discharge the interior walls of the capillary erode causing debris to be emitted from the discharge source. The debris can be destructive to the surrounding optics such as concave mirrors immediately adjacent to the capillary bore opening. The emitted debris can form a layer on the mirror, lowering reflectivity and thereby reducing its effectiveness. A layer of just 10 Angstroms (one atomic layer) can stop the mirror from reflecting radiation. Furthermore, large particles in the debris might cause destructive pits on the concave surface of the mirror as well.

SUMMARY OF THE INVTION

The first object of the present invention is to provide a physical barrier to optic harming debris that are ejected from a capillary discharge during the operation of a capillary discharge lamp.

The second object of the present invention is to provide a trap for collecting optic harming debris that are ejected from an operating capillary discharge lamp.

The third object of the present invention is to provide an increase in the gas pressure in the region at the emitting end of the capillary to enhance the useful emission from the capillary.

The fourth object of the present invention is to provide an angular pumped and emitting capillary (APEC) discharge source for applications in EUV lithography, microscopy, materials processing, metrology, resist analysis.

The fifth object of this invention is to provide an angular pumped and emitting capillary (APEC) discharge source for application in spectral regions such as the visible, ultraviolet, vacuum ultraviolet for laser pumping and the like, where small and very intense light sources are needed.

A first preferred embodiment of the invention is to provide an angular pumped and emitting capillary (APEC) discharge source having a configuration of placing an electrode to the on-axis direction coming out of the capillary bore so that a solid face of the electrode will intercept all or most of the particulate debris emission. The position of the electrode blocks debris coming from the capillary bore up to an angle of 15 degrees or greater from the axis of the capillary. This blocking electrode would naturally block the useful light emitted within that angle. This obstructing device, in addition to blocking the debris, can also be used as a location for providing additional gas in the emitting region as well as to provide a collecting region for the debris.

A second embodiment is related to providing the optimum gas pressure in the emitting region but still using the differentially-pumped capillary (DPC) geometry described in the background section of this invention. The DPC configuration is advantageous because it allows the EUV light to be collected without the use of a window between the lamp and the collecting optics. The DPC radiating gas pressure is very low in the emitting region. The gas pressure can be maintained at a higher level in that region, by extending the blocking device in the transverse direction to the capillary axis so as to extend the differential pumping beyond the emitting region. This would serve to increase the pressure in the emitting region. The same pressure increase would also be achieved by flowing gas into the region, either from an aperture in the blocking device or through one or more orifices at the end of the capillary.

A third embodiment has a discharge source formed between two electrodes without a capillary bore, wherein a first electrode can be a hollow cylinder and the second electrode can be U shaped. High pressure gas flows through the first electrode to the space between both electrodes. When a discharge occurs between the electrodes, the second electrode collects and blocks debris.

Further objects and advantages of this invention will be apparent from the following detailed description of a presently preferred embodiment which is illustrated schematically in the accompanying drawings.

DESCRIPTION OF THE PREFERRED EMBODIMENT

Before explaining the disclosed embodiment of the present invention in detail it is to be understood that the invention is not limited in its application to the details of the particular arrangement shown since the invention is capable of other embodiments. Also, the terminology used herein is for the purpose of description and not of limitation.

Figure 1:
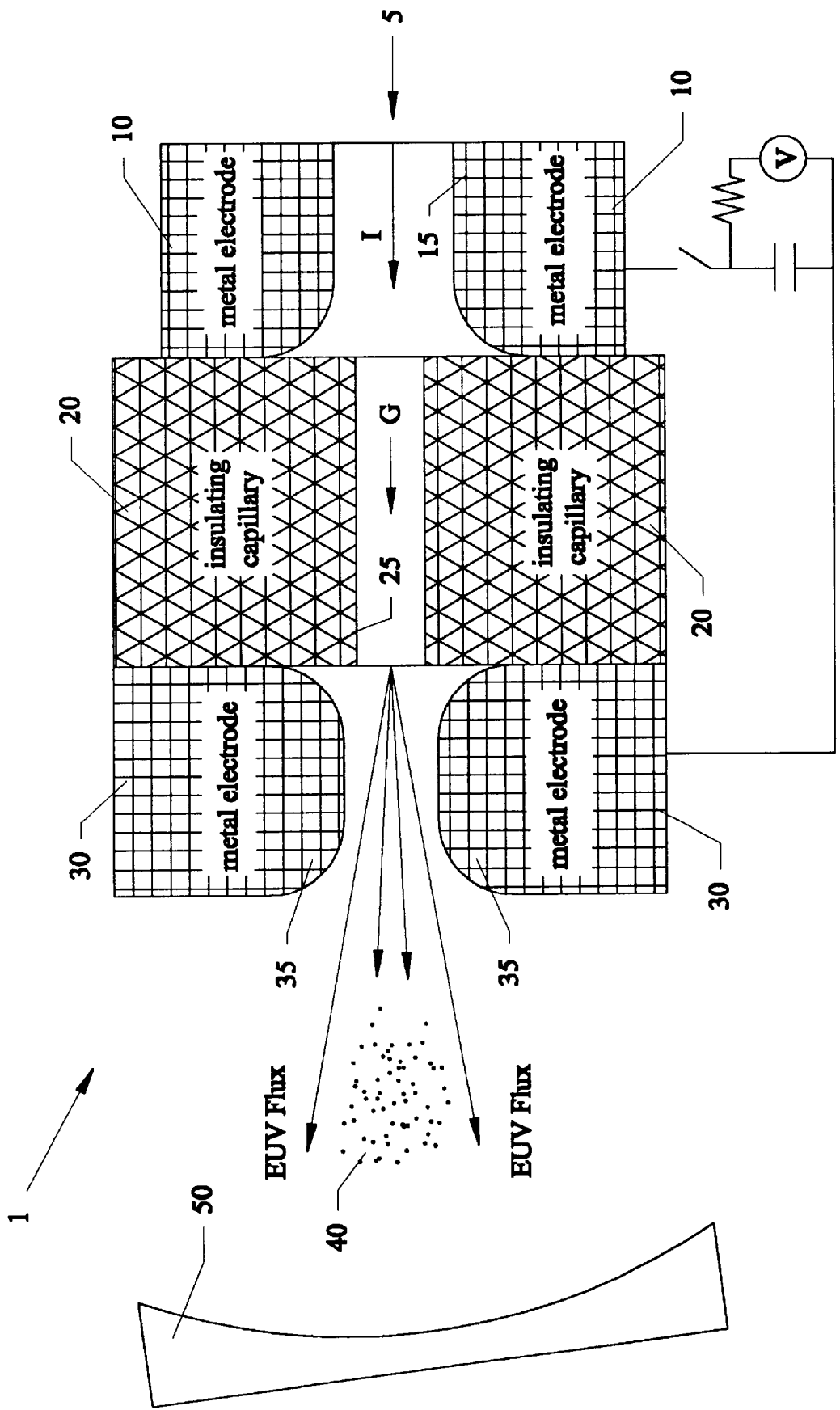
FIG. 1 is a side cross-sectional view of an end-emitting differentially pumped capillary (DPC) discharge source known to the inventors.

FIG. 1 is a side cross-sectional view 1 of an end-emitting differentially pumped capillary (DPC) discharge source. The DPC has metal electrode 10 having a port through-hole 15 for allowing gas G such as xenon 2 to enter through port 15 in the direction of arrow I from a high pressure region 5. On the opposite side of an electrically insulating or partially insulating capillary 20 is a second electrode 30. Electrodes 10 and 30 serve as electrical connections to the flowing gas G, that is located between those electrodes 10 and 30 within the capillary 20. When a voltage V, is applied between the electrodes 10, 30, an electric field is produced within the gas G between the electrodes 10, 30, and particularly within the capillary 20, that causes electrons to be accelerated and collide with the gaseous atoms to highly excited and ionized states that radiate the desired light for use in various applications that are describe above. An example of the differentially pumped capillary (DPC) discharge source of FIG. 1 along with operational ranges of current, pressure, repetition rate, and the like, is described and shown in U.S. Ser. No. 09/001,696 filed on Dec. 31, 1997, now U.S. Pat. No. 6,031,241, entitled: Capillary Discharge Extreme Ultraviolet Lamp Source for EUV Microlithography and other Related Applications now issued as U.S. Pat. No. 6,031,241, by the same assignee, which is incorporated by reference.

Referring to FIG. 1, gas G is flowed into the electrode region 10 at a selected pressure between approximately 0.1 and approximately 50 Torr and is pumped out at the radiation emitting end as described above such that the pressure beyond the emitting end 35 of the capillary 20 is less than approximately 0.1 to approximately 0.01 Torr (depending upon the absorption path length to the collecting optic) to avoid absorption of the EUV light emitted from the capillary. Debris 40 is produced when the current pulse is initiated within the capillary 20 and is ejected from the emitting end 35 of the capillary 20 and can be propelled toward optic components 50 (such as a multilayer concave reflecting mirror with alternating layers of molybdenum and silicon) that are used to collect the radiation E emitted from the end 35 of the capillary 20, thereby damaging the optics 50 either by pitting it with particle chunks of debris or by coating it with a layer of absorbing material.

Experimentally, a range of debris sizes was observed. A distribution was measured by microphotographing sample regions of silicon witness plates which have been exposed to many discharge pulses of the lamp at close proximity of approximately 5 cm. The observed debris sizes range from a maximum of 40 microns in diameter down to the diffraction limit of high power optical microscopes of approximately 0.5 microns. The relative distribution of the particle sizes was seen to depend strongly on the operating characteristics of the discharge such as but not limited to pressure, bore diameter, current, gas flow rate, and the like. Under low magnification, the particle deposition field on the witness plate was observed to be localized and centered on the projection of the capillary bore axis. The debris field observed was approximately 1 cm in extent (full width), which means that the overwhelming majority of the particulate debris was ejected from the capillary at angles from 0 to 6 degrees with respect to the capillary axis. These observations form the physical foundation for the usefulness of the APEC geometry in producing EUV radiation with greatly reduced debris reaching regions beyond the lamp.

All debris exiting from the lamp region is potentially damaging to EUV collecting optics facing the output of the capillary discharge. Submicron-sized particles down to single atoms produce a coating on the surface of the optics which leads to partial absorption of the EUV light. Larger particles, especially those greater than approximately 10 microns in diameter, can crater and dig into the surface of the optics, thereby reducing the useful EUV flux.

Figure 2:
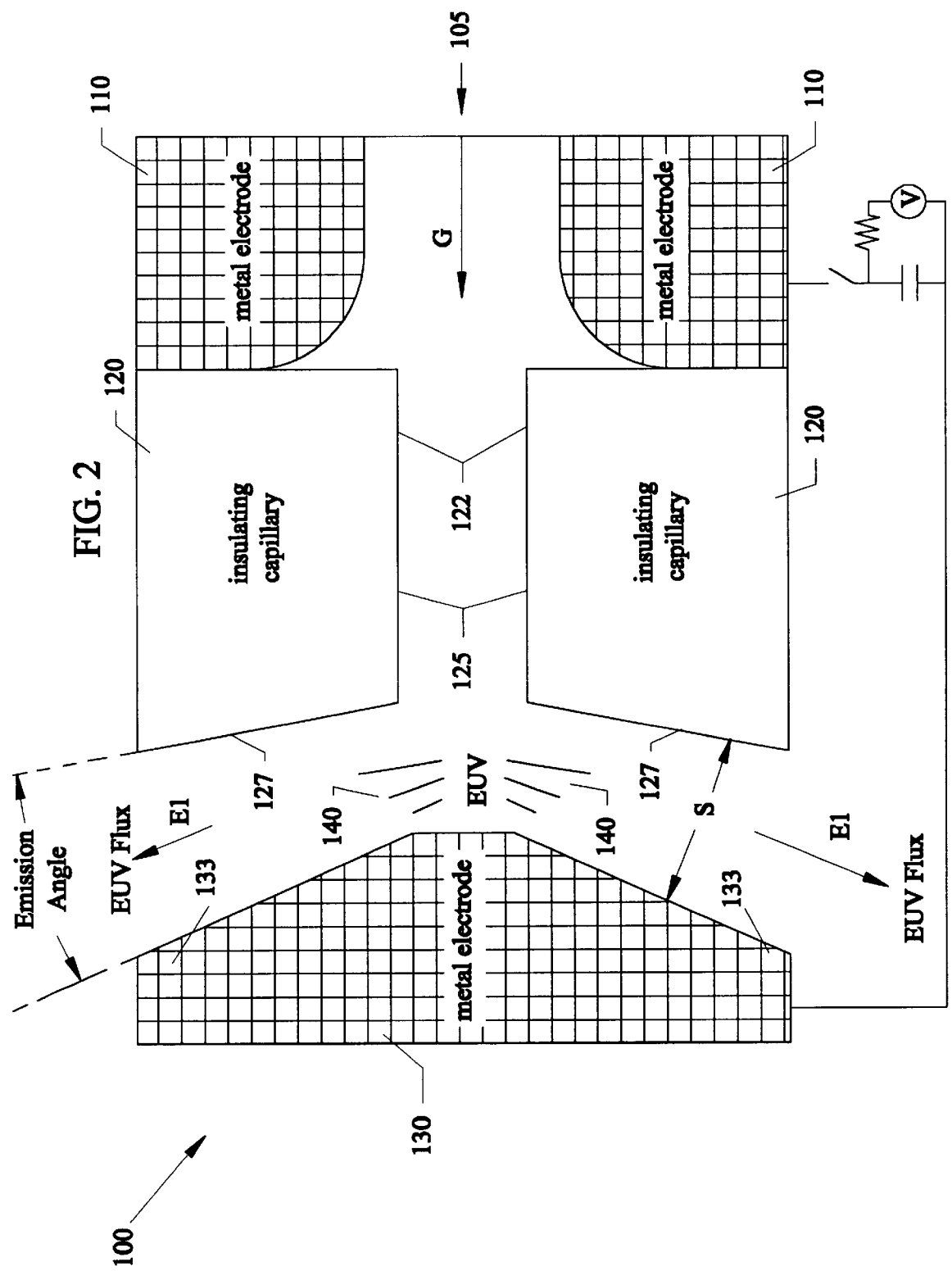
FIG. 2 is a side cross-sectional view of a first embodiment of an angular pumped and emitting capillary (APEC) discharge source of the subject invention.

FIG. 2 is a side cross-sectional view 100 of a first embodiment of an angular pumped and emitting capillary (APEC) discharge source of the subject invention. The uniqueness of the APEC is the geometry of the capillary 120 and electrode 130 at the light emitting end 127 of the capillary 120. Referring to FIG. 2, the APEC 100 overcomes the debris problem of the FIG. 1 embodiment as well as to allow for more collection of light from the capillary. The APEC 100 differs from the DPC 1 of FIG. 1 in that the radiation E is emitted in an angular direction E1 (because the pressure is typically higher than the ordinary DPC 1 of FIG. 1), symmetrically around the capillary 120 at the low pressure end 127. The capillary end region 127 is tapered as is the end 133 of the electrode 130 with an adjustable space S (approximately 0.1 mm to approximately 5 mm for DPC 1 and approximately 0.1 mm and up if only the collecting trap is used), between them. The radiation E1 that is collected at optics 150 (shown in FIG. 1) comes primarily from the mouth 127, 133 of the cathode as well as from the area between electrodes 110, 130. This angular tapered region 127 allows the light E1 to be collected in a large solid angle which in FIG. 2 can range from approximately 15 degrees or greater with respect to the axis of capillary 120. This geometry also allows differential pumping to continue through the tapered region so that the pressure in the emitting region 127 at the end of the capillary bore 125 is still at sufficiently high pressure to generate high radiation flux and also to provide sufficient gas to allow conduction of the discharge current to the electrode 130.

Referring to FIG. 2, the electrode 130 also provides a direct blocking path for any debris that might be generated within the bore region 125 as the discharge current passes through the capillary 120. Different angles can be used within the angular region as well as different gaps between the capillary bore mouth 127 and the electrode 130 to allow for optimization of the radiation flux output. The flux output can be measured with a calibrated EUV diode type meter, so that the separation space is adjusted between the end of the capillary and the blocking means, until a maximum radiation is achieved.

At the high pressure end 122 of the capillary bore 125 where the gas G is flowed into the capillary 120, the electrode 110 can be of several configurations including the hollow cylinder shape as shown in FIG. 2 or a solid cylinder shape that is inserted within the capillary bore region with the gas flowed is around the cylinder or flowed through a hole in the cylinder electrode. Another version might be a heated filament as a cathode.

Figure 3:
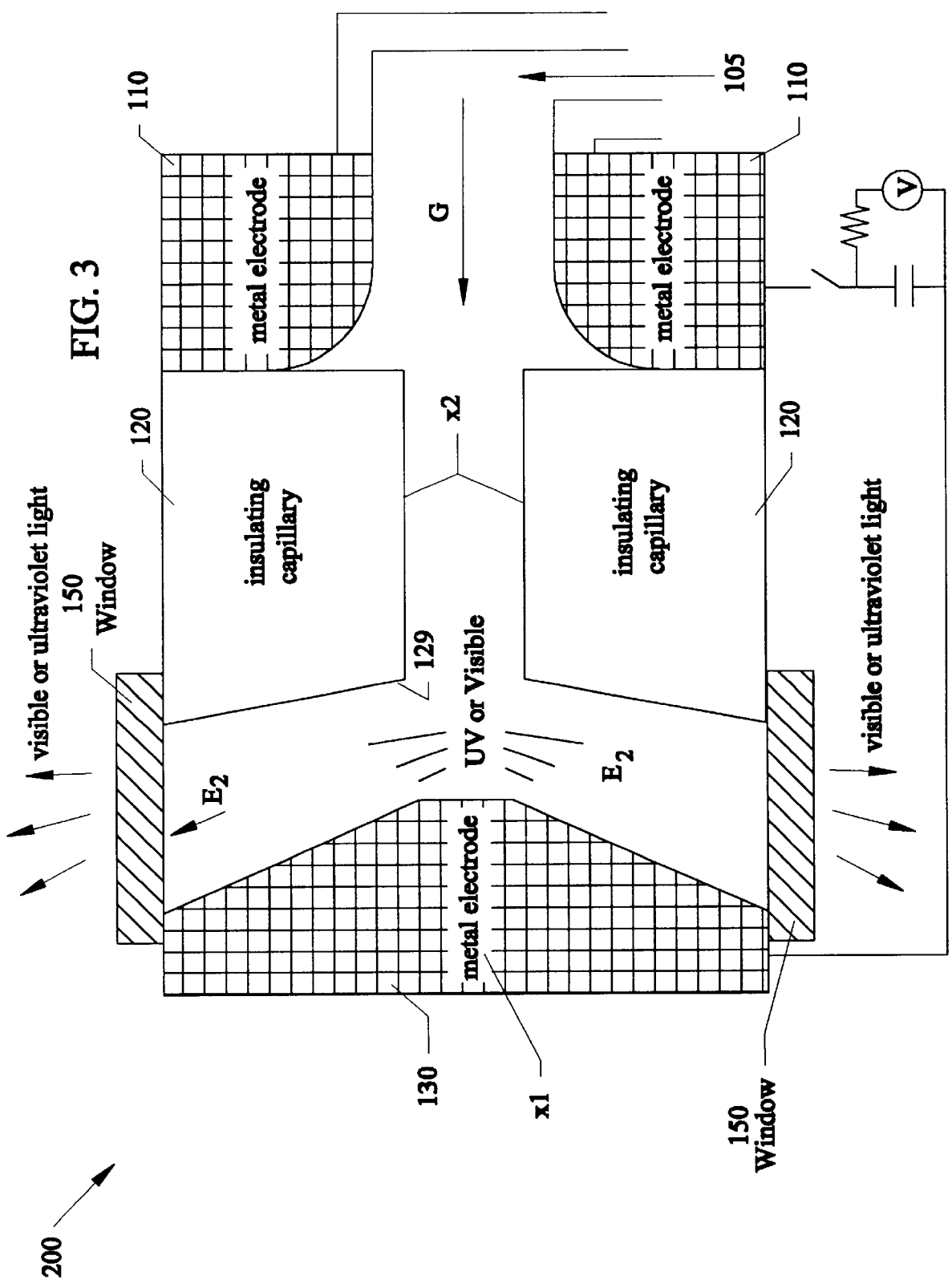
FIG. 3 is a side cross-sectional view of a second embodiment of an angular pumped and emitting capillary (APEC) discharge source of the subject invention incorporating a window around the emitting region and having a constant pressure of the gas within that region, rather than operate with differential pumping.

FIG. 3 is a side cross-sectional view 200 of a second embodiment of an angular pumped and emitting capillary (APEC) discharge source of the subject invention incorporating a window 150 around the emitting region and having a constant pressure of the gas within that region, rather than operate with differential pumping. The APEC device of FIG. 3 is for obtaining intense visible, ultraviolet, or vacuum ultraviolet emission. This version incorporates a window 150 around the emitting region E2 and has a constant pressure of the gas within that region, rather than operate with differential pumping. Here the insulating capillary would be simple in shape, with the end face of the capillary normal to the bore axis. In this case the large electrode 130 would serve to block and collect debris and there would be a much larger angular admitting region because differential pumping would not be required to avoid absorption of the emission E2 by the emitting gas outside of the bore region.

Figure 4A:
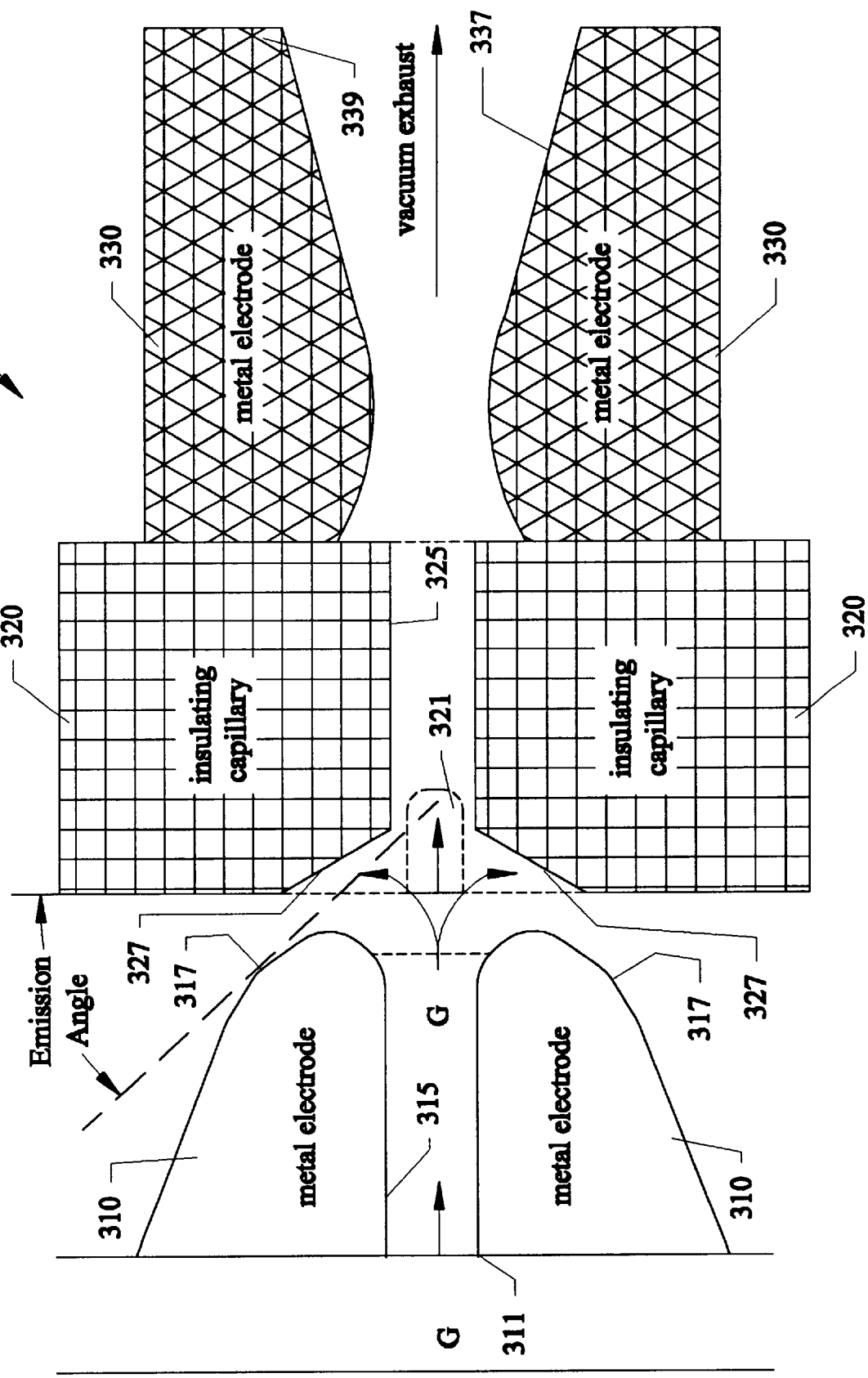
FIG. 4A is a side cross-sectional view of a third embodiment of an angular pumped and emitting capillary(APEC) discharge source of the subject invention.

FIG. 4A is a side cross-sectional view 300 of a third embodiment of an angular pumped and emitting capillary (APEC) discharge source of the subject invention. This embodiment is a variation on the APEC design shown in FIG. 2. Here the principal functional difference is that the gas is admitted to the system from the same end at which the useful eight is emitted. Discharge conditions and parameters are identical to the APEC 100. Referring to FIG. 4A, the angular pumped and emitting capillary 320 of embodiment 300, has metal electrodes 310 and 330 at opposite ends of an insulating capillary 320 whose bore 325 is filled with gas (i.e., Xenon helium, neon, argon, and krypton, which were referred to in U.S. Pat. No. 6,031,241 to the same inventors and same assignee, which has been incorporated by reference) under electrical discharge conditions. Both the metal electrodes 310 and 330 are hollow with axial bores 315 and 335–337 respectively. Gas G is flowed into the discharge region through the axial bore hole 315 in the metal electrode 310 located at the end of the capillary from which the useful radiation is emitted. Gas is admitted to this electrode by a gas inlet 311 connected to plumbing (not shown in FIG. 4A) in a similar fashion to the APEC 100. Outflowing gas enters both the capillary bore 325 and the annular gap between the electrode face 317 and the capillary face 327, which bound the line-of-site of the emitted useful radiation. This results in a region 321 of high gas density in the region of the discharge seen directly along the line-of-sight, which increases radiated output relative to the simpler APEC 100. Gas is pumped away both in the low pressure region into which the radiation is emitted, and also through the vacuum exhaust bore hole 339 in the metal electrode 330 on the opposite side of the capillary.

Additionally, the holes 315, 339 in both electrodes 310, 330 serve as "shock tubes", which guide the discharge-induced gas pressure pulse by allowing an unimpeded path for axial gas to flow. Much of the particulate debris shot out the radiating end 317, 327 of the capillary bore would simply travel down the gas inlet line and come to rest deep in the gas reservoir behind the electrode 310. Finally, the flowing gas may serve to cool and protect the components. A tube of flowing gas exhausting into vacuum forms a Mach 1 nozzle. The kinetic temperature in a Mach 1 expansion is for a monatomic ideal gas, three-fourths of the reservoir temperature. If the inlet gas is cooled nearly to its freezing point temperature (to less than ⅘ its freezing temperature in Kelvins) then the expansion should cause gas to freeze out on the tip of the electrode and inner wall of the capillary bore, to serve as an ablative buffer which may reduce bore erosion and debris formation in the first place. Gas that does not freeze out would flow more slowly and have a higher atom density for a given inlet pressure, which also would be salutory from the standpoint of maximizing the radiator density at the radiating end of the capillary. Finally, it cools the capillary material making it a better insulator.

Figure 4B:
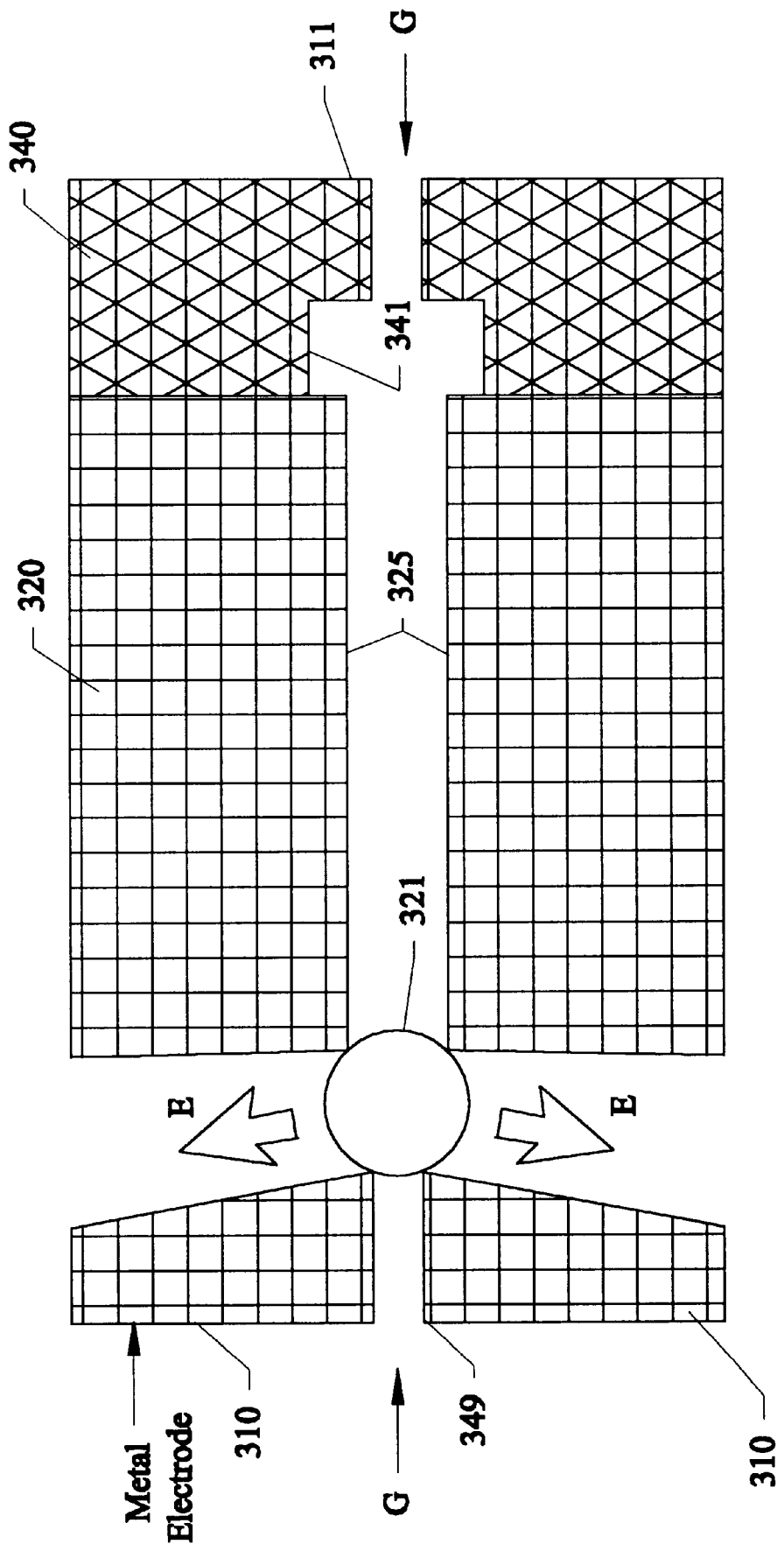
FIG. 4B is another view of FIG. 4A showing arrows for gas flow, and EUV emission.

Another variation on the modified APEC design is shown in FIG. 4B. Here, the radiating gas G flowed into the capillary 320 through both metal electrodes 310 and 340. Electrode 340 has a C-cross-sectional shape with interior 341 and gas inlet 349. Gas exhaust and useful radiation E are removed by the vacuum region containing the optics as for the simpler APEC 100. This configuration maintains a more nearly uniform high density of gas throughout the length of the capillary than any other design.

Figure 5:
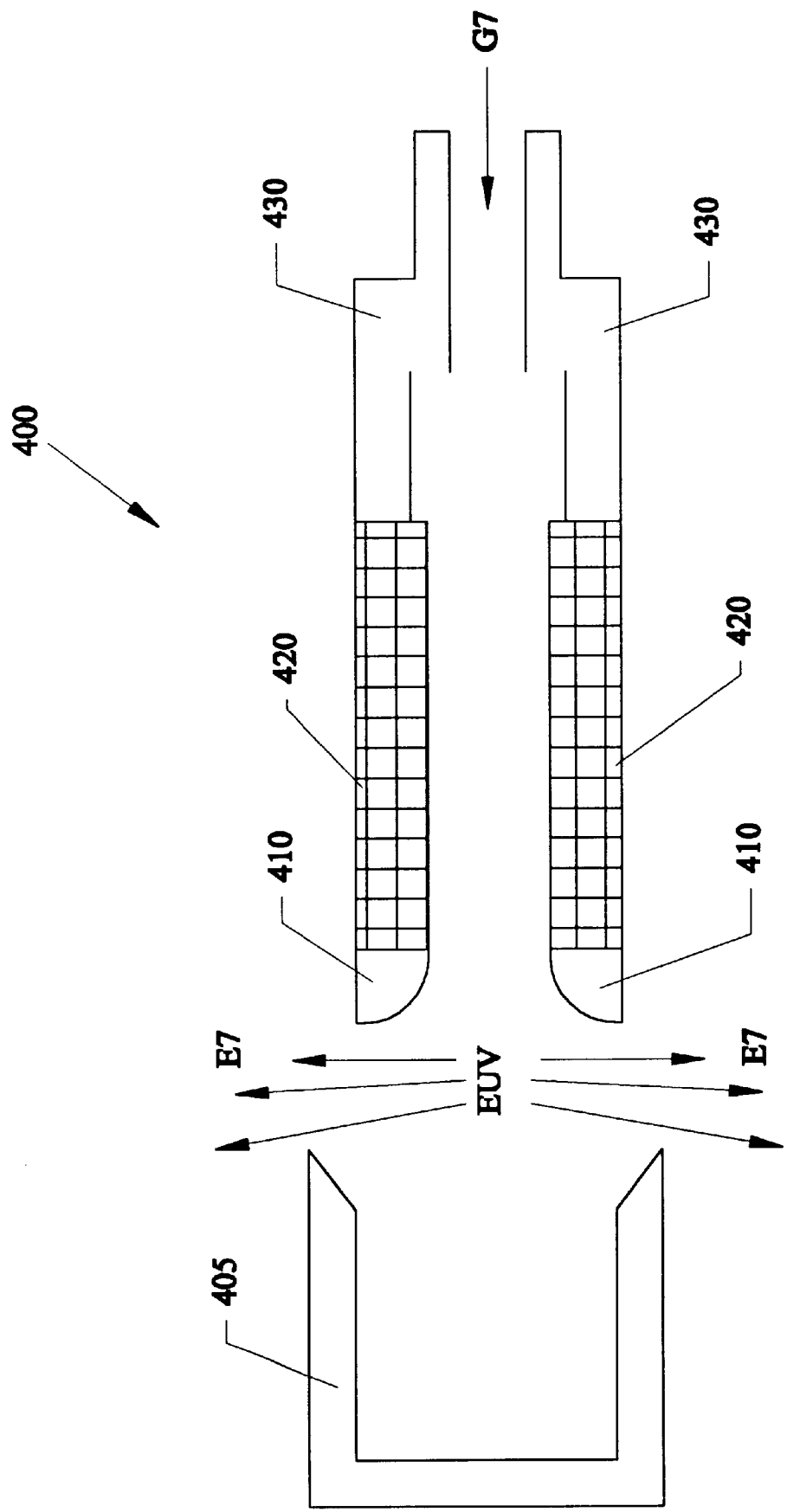
FIG. 5 is a side cross-sectional view of a fourth embodiment of a capillary discharge lamp with a debris collecting device attachment.

FIG. 5 is a side cross-sectional view 400 of a fourth embodiment 400 of a capillary discharge lamp with a debris collecting device attachment 405. The assembly consisting of electrodes 410 and 430, capillary 420, and gas flow G7 is functionally identical to the DPC 1, FIG. 1. The debris collection device 405, in its most simple form a metal cup, kinetically intercepts the debris particles (40, in FIG. 1) while allowing the useful radiation E7 at greater axial angles to escape and be collected by optics (50, in FIG. 1). The debris collector 405 would subtend a full angle of at least 12 degrees along the capillary axis; its size would therefore depend on its distance from the end of the capillary. The collector 405 can be at the same or different voltage as the electrode 410. Choice of material for the debris collector 405 would include but not be limited to stainless steel, aluminum, brass, copper and the like materials. The use of insulators as collector materials would be problematic, as electrical charging in the presence of plasma could affect debris trajectories in an uncontrolled way. Shape of the collector is probably unimportant. A U-shaped device 405 as illustrated in FIG. 5 would intercept most secondary debris coming off the collector surface itself.

Figure 6:
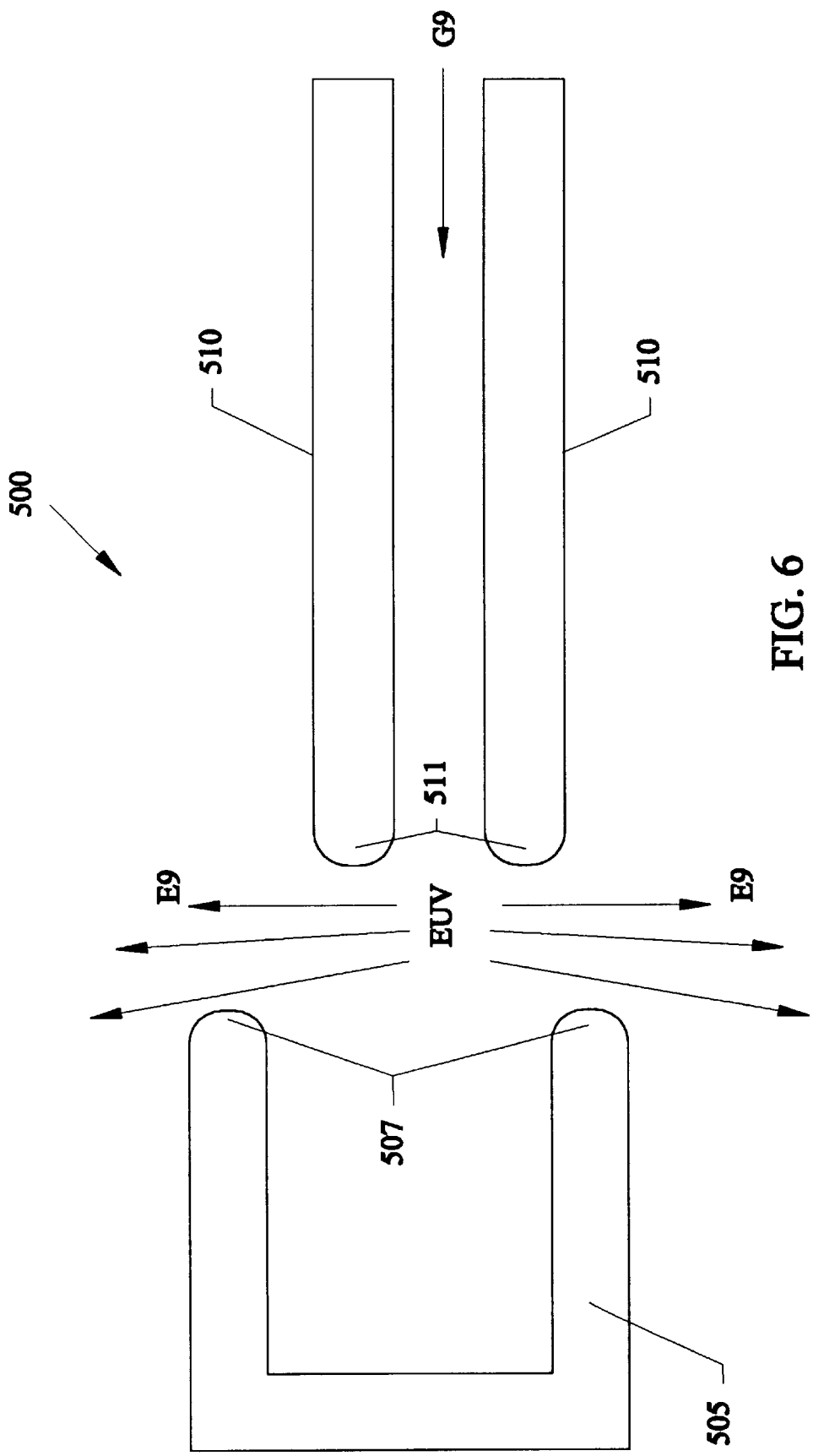
FIG. 6 shows a discharge device without a capillary bore where high pressure flows through one electrode and debris generated by the discharge formed between both electrodes is collected and blocked by the second electrode.

FIG. 6 represents another embodiment of the discharge device with a U-shaped debris blocker/collector 505 that does not use a capillary associated with generating the discharge. Referring to FIG. 6, high pressure gas G9 is flowed through one cylindrical electrode 510 and a debris collecting (or just blocking) device 505 also serves as the other electrode 505. The EUV emission E9 is produced in the region where the gas exits the between electrode ends 507 of the debris catching electrode 505 and the ends 511 of the cylindrical electrode 510. The shape of the collector 505 in this case is more important than for the collector 405 (FIG. 5) since collector 505 also serves as an electrode. Electrical impedance between electrode faces 507 and 511 will determine distance between electrodes, and angular intercept requirements will in turn constrain the collectors size. Surface figure on end faces 507 will also be important. Collector material will require tolerance to high current throughput and high temperatures, and like before, the concave/U shape 505 will help to decrease secondary debris.

The discharge lamp operating at wavelengths longer than approximately 100 nm can be used for materials processing, medical treatment such as photodynamic therapy, and other applications where pulsed high flux vacuum ultraviolet, ultraviolet, visible and near infrared wavelengths of light are required.

This source can have applications for an EUV microscope. Such a microscope could be used to observe features as small as 0.05 microns (50 nm) and have very large depth of focus. One application would be as an inspection tool on a microlithography fab line in which great depth of focus is required to observe the resist or chip feature side-walls for uniformity and wall slope. It might also be used in hospitals, for example in pathology labs, where a tissue sample (biopsy) needs to be inspected immediately after it is taken from a patient. The microscope can also be used for general high resolution analysis in chemical and pharmaceutical labs.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. An angular pumped and emitting capillary (APEC) discharge light source, comprising:

a first electrode having a gas inlet port;

a partially insulating capillary attached to one side of the electrode, having an inlet bore in fluid connection to the gas inlet port of the first electrode, and an outlet bore; and a second electrode facing the outlet bore of the insulating capillary, wherein applying a voltage between the electrodes causes light to be emitted from the outlet bore of the capillary, and debris formed within the capillary are prevented from exiting the outlet bore of the capillary by the second electrode.

2. The angular pumped and emitting capillary (APEC) discharge light source of claim 1, wherein the light emitted includes:

EUV light.

3. The angular pumped and emitting capillary (APEC) discharge light source of claim 1, wherein the light emitted includes:

visible light.

4. The angular pumped and emitting capillary (APEC) discharge light source of claim 1, wherein the light emitted includes:

ultraviolet light.

5. The angular pumped and emitting capillary (APEC) discharge light source of claim 1, wherein the light emitted includes:

vacuum ultraviolet light.

6. The angular pumped and emitting capillary (APEC) discharge light source of claim 1, wherein the outlet bore of the capillary includes:

an emitting region having an inwardly angled tapered outlet bore.

7. The angular pumped and emitting capillary (APEC) discharge light source of claim 6, wherein the second electrode includes:

a portion facing the outlet bore and having an outwardly tapered surface, so that the radiation is emitted in an angular direction, and the second electrode blocks any debris generated within the capillary from being expelled into collecting optics.

8. The angular pumped and emitting capillary (APEC) discharge light source of claim 1, wherein the inlet and the outlet bore of the capillary includes:

a diameter would range between approximately 0.5 mm and approximately 2.5 mm and an overall length range between approximately 1 mm and approximately 10 mm.

9. The angular pumped and emitting capillary (APEC) discharge light source of claim 1, further including:
a gap spacing between the second electrode and the outlet bore region less than an interior bore diameter of the capillary.

10. The angular pumped and emitting capillary (APEC) discharge light source of claim 1, further includes:
a tapered surface having an outer diameter larger than an interior bore diameter of the capillary.

11. The angular pumped and emitting capillary (APEC) discharge light source of claim 1, wherein the capillary includes:
a semiconducting material.

12. The angular pumped and emitting capillary (APEC) discharge light source of claim 1, further comprising:
a transparent window about the capillary for allowing wavelengths of at least 100 nm to be generated.

13. An angular pumped and emitting capillary (APEC) discharge light source, comprising:
a first electrode having a gas inlet port;
a partially insulating capillary attached to one side of the electrode, having an inlet bore in fluid connection to the gas inlet port of the first electrode, and an outlet bore; and
a second electrode adjacent to the capillary; and
a collector means facing the outlet bore of the insulating capillary, wherein applying a voltage between the electrodes causes light to be emitted from the outlet bore of the capillary, and debris formed within the capillary are collected by the collector means.

14. The angular pumped and emitting capillary discharge light source of claim 13, wherein the second electrode and the collector means are one and the same.

15. The angular pumped and emitting capillary discharge light source of claim 13, wherein the second electrode and the collector means are different components.

16. An angular pumped and emitting capillary (APEC) discharge light source, comprising:
a first electrode;
a partially insulating capillary attached to one side of the first electrode, having an outlet bore with an emitting region; and
a second electrode adjacent to the capillary;
through-hole means in the capillary for directing inlet gas into the capillary for providing a higher pressure and increasing emission flux in the emitting region; and
a collector-blocking means facing the outlet bore of the insulating capillary, wherein applying a voltage between the electrodes causes light to be emitted from the emitting region of the capillary, and debris formed within the capillary are collected by the collector means.

17. The angular pumped and emitting capillary discharge light source of claim 16, wherein the second electrode and the collector-blocking means are one and the same.

18. The angular pumped and emitting capillary discharge light source of claim 16, wherein the second electrode and the collector-blocking means are different components.

19. A discharge device for generating a discharge plasma for forming EUV flux, from two electrodes without using a capillary between the two electrodes, comprising:
a first electrode having a conduit for introducing an emitting gas therethrough;
a second electrode spaced apart by a gap to the first electrode, wherein applying a voltage to the first electrode and the second electrode forms an emitting region in the gap so that the second electrode serves to block and collect electrode debris material; and
means for pumping gas away from the emitting region so as to provide a low pressure for transmission of EUV flux.

20. The discharge device for generating the discharge plasma of claim 19, wherein the gas emitting gas is introduced at a pressure of at least approximately 0.1 Torr, and the emitting gas is chosen from one of xenon, helium, neon, argon and krypton.

* * * * *